US011067290B2

(12) United States Patent
Chen et al.

(10) Patent No.: US 11,067,290 B2
(45) Date of Patent: Jul. 20, 2021

(54) CABINET AND SLIDE RAIL KIT THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shih-Lung Huang, Kaohsiung (TW); Cheng-I Hsu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/794,419

(22) Filed: Feb. 19, 2020

(65) Prior Publication Data

US 2021/0102709 A1  Apr. 8, 2021

(30) Foreign Application Priority Data

Oct. 7, 2019  (TW) ................. 108136501

(51) Int. Cl.
*F24C 15/16*  (2006.01)
(52) U.S. Cl.
CPC .................. *F24C 15/16* (2013.01)
(58) Field of Classification Search
CPC ........ F24C 15/16; F24C 15/168; A47B 88/57; A47B 88/417; A47B 88/16; A47B 2210/0016; A21B 1/50; A21B 3/155
USPC .... 312/333, 215, 217, 218, 222, 350, 332.1, 312/334.44, 334.46, 330.1, 334.7, 334.8, 312/410; 126/339, 337 R; 211/126.15, 211/153, 162, 181.1, 134
See application file for complete search history.

(56) References Cited

U.S. PATENT DOCUMENTS

| | | | | | |
|---|---|---|---|---|---|
| 2,456,988 | A | * | 12/1948 | Pierson | F24C 15/12 99/446 |
| 3,746,418 | A | * | 7/1973 | Barber, Jr. | A47B 88/57 312/334.45 |
| 4,168,103 | A | * | 9/1979 | Hagen | E05B 65/462 312/219 |
| 5,262,923 | A | * | 11/1993 | Batta | G06F 1/184 312/333 |
| 6,883,884 | B2 | * | 4/2005 | Chen | E05C 3/14 312/333 |
| 6,938,617 | B2 | * | 9/2005 | Le | F24C 15/16 126/273 R |

(Continued)

FOREIGN PATENT DOCUMENTS

CN  206596320 U  10/2017
EP  3505010 A1  7/2019

*Primary Examiner* — Janet M Wilkens
(74) *Attorney, Agent, or Firm* — Rosenberg, Klein & Lee

(57) ABSTRACT

A cabinet and a slide rail kit thereof are disclosed. The cabinet includes an equipment body and a slide rail mechanism. The equipment body includes a first wall and a second wall. One of the first wall and the second wall is provided with a guiding path. The guiding path includes a blocking feature. The slide rail mechanism includes a supporting rail and a stop. The stop can be moved with respect to the supporting rail. When at a particular position, the stop can be blocked by the blocking feature of the guiding path to prevent the supporting rail from being displaced with respect to the equipment body from a predetermined position in a certain direction.

17 Claims, 14 Drawing Sheets

(56) References Cited

U.S. PATENT DOCUMENTS

| | | | |
|---|---|---|---|
| 7,216,646 B2 | 5/2007 | Le et al. | |
| 7,963,408 B2* | 6/2011 | Glover | A47B 88/57 |
| | | | 211/126.15 |
| 8,007,060 B2* | 8/2011 | Duan | G06F 1/183 |
| | | | 312/334.44 |
| 8,393,692 B2* | 3/2013 | Yu | H05K 7/1489 |
| | | | 312/333 |
| 8,499,944 B2 | 8/2013 | Parks et al. | |
| 9,297,539 B2* | 3/2016 | Ambrose | B23P 19/00 |
| 9,408,462 B1* | 8/2016 | Hong | A47B 88/57 |
| 9,605,853 B2* | 3/2017 | Hoffman | F24C 15/168 |
| 2009/0200906 A1* | 8/2009 | Dao | F24C 15/16 |
| | | | 312/410 |
| 2011/0132348 A1* | 6/2011 | Smith | F24C 15/16 |
| | | | 126/339 |
| 2012/0097147 A1* | 4/2012 | Steurer | F24C 15/16 |
| | | | 126/339 |
| 2016/0178217 A1* | 6/2016 | Ambrose | F24C 15/16 |
| | | | 126/339 |

\* cited by examiner

CABINET AND SLIDE RAIL KIT THEREOF

FIELD OF THE INVENTION

The present invention relates to a cabinet and a slide rail kit thereof. More particularly, the invention relates to a slide rail mechanism that can be mounted and dismounted with ease.

BACKGROUND OF THE INVENTION

U.S. Pat. No. 8,499,944 B2 discloses a baking stone rack for use in an oven, wherein the oven can be viewed as an example of a cabinet. As shown in FIG. 8 of the specification of this US patent, the support frame of the baking stone rack can be supported by the guide rails in the oven. Each of the two lateral sides of the support frame of the baking stone rack includes an upward-facing projection, and the guide rails in the oven have corresponding downward-facing projections. The upward-facing projections are configured to contact the downward-facing projections so as to stop the baking stone rack at a proper position in the oven when the baking stone rack is put into the oven.

Given the diversity of market demands, it is worthwhile to develop a product that is different from the afore-cited rack.

SUMMARY OF THE INVENTION

One objective of the present invention is to provide a cabinet that has a slide rail mechanism.

Another objective of the present invention is to provide a slide rail kit that can be rapidly installed and removed without difficulty.

According to one aspect of the present invention, a cabinet includes an equipment body and a first slide rail mechanism. The equipment body includes a first wall and a second wall, and one of the first wall and the second wall is provided with a first guiding path. The first guiding path has a front end, a rear end, and a blocking feature between the front end and the rear end. The first slide rail mechanism includes a supporting rail and a stop. The stop can be operated and thereby moved with respect to the supporting rail. When at a first position, the stop can be blocked by the blocking feature of the first guiding path in order to prevent the supporting rail from being displaced with respect to the equipment body from a first predetermined position in an opening direction.

Preferably, the stop when at a second position cannot be blocked by the blocking feature of the first guiding path and thus allows the supporting rail to be displaced with respect to the equipment body from the first predetermined position in the opening direction.

Preferably, the first slide rail mechanism further includes an operating member for operating the stop and thereby displacing the stop with respect to the supporting rail from the first position to the second position.

Preferably, the first slide rail mechanism further includes an elastic member for applying an elastic force to the operating member so that the operating member can keep the stop at the first position via the elastic force of the elastic member.

Preferably, the first slide rail mechanism further includes a first stop portion disposed at the supporting rail. The first stop portion is configured to be blocked at a second side of the blocking feature of the first guiding path in order to prevent the supporting rail from being displaced with respect to the equipment body from the first predetermined position in a retracting direction.

Preferably, the first slide rail mechanism further includes a second stop portion disposed at the supporting rail. When the supporting rail reaches a second predetermined position after being displaced with respect to the equipment body from the first predetermined position in the opening direction, the second stop portion is blocked at a first side of the blocking feature of the first guiding path to prevent the supporting rail from being displaced with respect to the equipment body from the second predetermined position in the opening direction.

Preferably, by applying a force to the supporting rail and thereby tilting the supporting rail through an angle with respect to the first guiding path, the second stop portion is freed from blockage at the first side of the blocking feature of the first guiding path so that the supporting rail can be detached with respect to the equipment body from the second predetermined position in the opening direction.

Preferably, the first slide rail mechanism further includes a movable rail that can be longitudinally displaced with respect to the supporting rail and that is configured to carry an object. Preferably, the first wall and the second wall define a space therebetween for receiving the object.

Preferably, the other of the first wall and the second wall is provided with a second guiding path, and the second guiding path has substantially the same structural configuration as the first guiding path. Preferably, the cabinet further includes a second slide rail mechanism, and the second slide rail mechanism has substantially the same structural configuration as the first slide rail mechanism.

Preferably, the cabinet further includes a supporting member connected between the second slide rail mechanism and the first slide rail mechanism.

According to another aspect of the present invention, a slide rail kit includes a supporting rail, a bracket, and an operating member. The bracket is connected to the supporting rail and includes a first stop portion, a second stop portion, and a stop between the first stop portion and the second stop portion. The operating member is connected to the stop and can be operated in order to operate the stop and thereby displace the stop from a first position to a second position. The stop is substantially on the same horizontal plane as the first stop portion and the second stop portion when at the first position and is not on the same horizontal plane as the first stop portion and the second stop portion when at the second position.

Preferably, the slide rail kit further includes an elastic member for applying an elastic force to the operating member so that the operating member can keep the stop at the first position via the elastic force of the elastic member.

Preferably, the bracket has a position limiting feature, and the stop has a limited range of travel defined by the position limiting feature.

Preferably, the position limiting feature is a slot, or long groove, with a boundary and brings two opposite sides of the bracket into communication, and the stop extends through a portion of the position limiting feature to establish the limited range of travel.

Preferably, the orientation of the position limiting feature is substantially perpendicular to the longitudinal direction of the supporting rail.

Preferably, the operating member is configured to be linearly displaced in order to drive the stop into displacement.

Preferably, the operating member has a body portion and an operating portion. The stop is connected to the body portion. The operating portion of the operating member is located above the bracket.

Preferably, the slide rail kit further includes a movable rail and a middle rail. The movable rail can be longitudinally displaced with respect to the supporting rail. The middle rail is movably mounted between the movable rail and the supporting rail to increase the distance for which the movable rail can be displaced with respect to the supporting rail.

BRIEF DESCRIPTION OF THE DRAWINGS

FIG. 5A is an enlarged view of the circled area in FIG. 5.

FIG. 6A is an enlarged view of the circled area in FIG. 6.

DETAILED DESCRIPTION OF THE INVENTION

Figure 1:
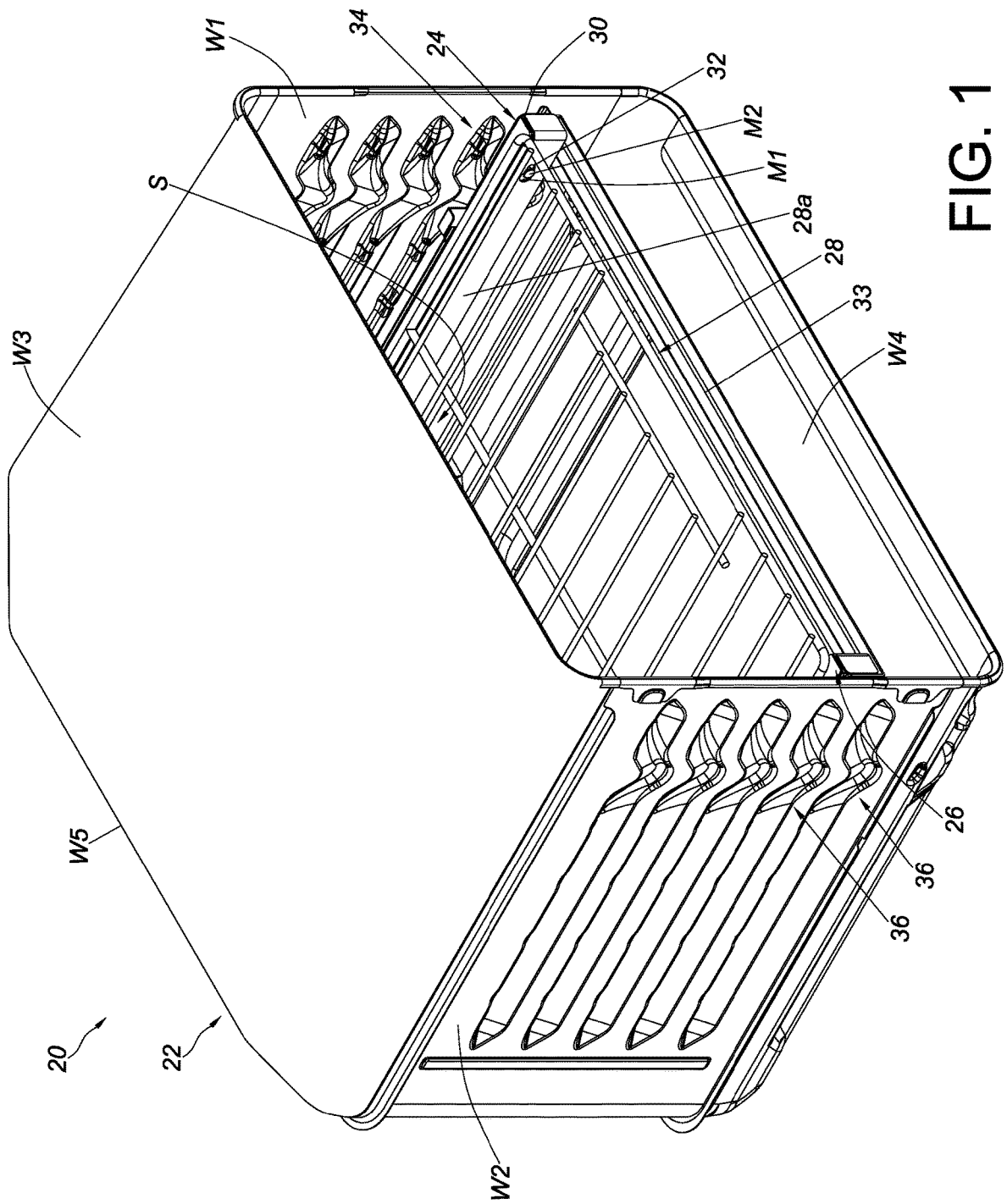
FIG. 1 is a perspective view of a cabinet according to an embodiment of the present invention, showing an object in a retracted state with respect to the cabinet.

Referring to FIG. 1, the cabinet 20 according to an embodiment of the present invention includes an equipment body 22, a first slide rail mechanism 24, and preferably also a second slide rail mechanism 26. In this embodiment, and by way of example, the cabinet 20 is an oven, and the equipment body 22 is the enclosing structure of the oven. Implementation of the cabinet 20 and of the equipment body 22, however, is not limited to the foregoing.

The equipment body 22 includes a first wall W1 and a second wall W2. Preferably, the first wall W1 and the second wall W2 are two corresponding lateral walls of the equipment body 22, and a space S is defined between the first wall W1 and the second wall W2 in order to receive an object 28. In this embodiment, the object 28 may be, but is not limited to, an oven rack or an oven tray. Preferably, the equipment body 22 further includes a top wall W3, a bottom wall W4, and a rear wall W5. The top wall W3 is connected between an upper portion of the first wall W1 and an upper portion of the second wall W2. The bottom wall W4 is connected between a lower portion of the first wall W1 and a lower portion of the second wall W2. The rear wall W5 is connected between a rear portion of the first wall W1 and a rear portion of the second wall W2. The first wall W1, the second wall W2, the top wall W3, the bottom wall W4, and the rear wall W5 jointly define the space S.

The first slide rail mechanism 24 and the second slide rail mechanism 26 have substantially the same structural configuration, so for the sake of brevity, only the first slide rail mechanism 24 will be described below. The first slide rail mechanism 24 includes a supporting rail 30 and preferably also a movable rail 32 that can be longitudinally displaced with respect to the supporting rail 30. The supporting rail 30 is disposed on the first wall W1 of the equipment body 22. The movable rail 32 is configured to carry the object 28. For example, the object 28 is connected to the movable rail 32 through a mounting portion 28a (wherein the mounting portion 28a and the movable rail 32 can be viewed as a single unit) and can therefore be pulled out of and retracted into the space S of the equipment body 22 with respect to the first slide rail mechanism 24 via the movable rail 32. The mounting portion 28a and the movable rail 32 have a first mounting feature M1 and a second mounting feature M2 respectively. The first mounting feature M1 and the second mounting feature M2 are configured to connect to each other by, for example, a detachable connection method, e.g., by being fastened to, engaged with, or threadedly connected to each other in a detachable manner. Here, and by way of example, the first mounting feature M1 and the second mounting feature M2 are a projection and a hole (or groove) respectively or vice versa and are configured to be engaged with and/or fastened to each other. Implementation of the two mounting features, however, is not limited to the foregoing. Preferably, the cabinet 20 further includes a supporting member 33 connected between the second slide rail mechanism 26 (or more particularly its supporting rail 30) and the first slide rail mechanism 24 (or more particularly its supporting rail 30). The supporting member 33 can be used, for example, to increase the stability with which the second slide rail mechanism 26 and the first slide rail mechanism 24 are mounted in the equipment body 22 or to improve the structural strength or supporting strength of the second slide rail mechanism 26 and of the first slide rail mechanism 24.

Figure 2:
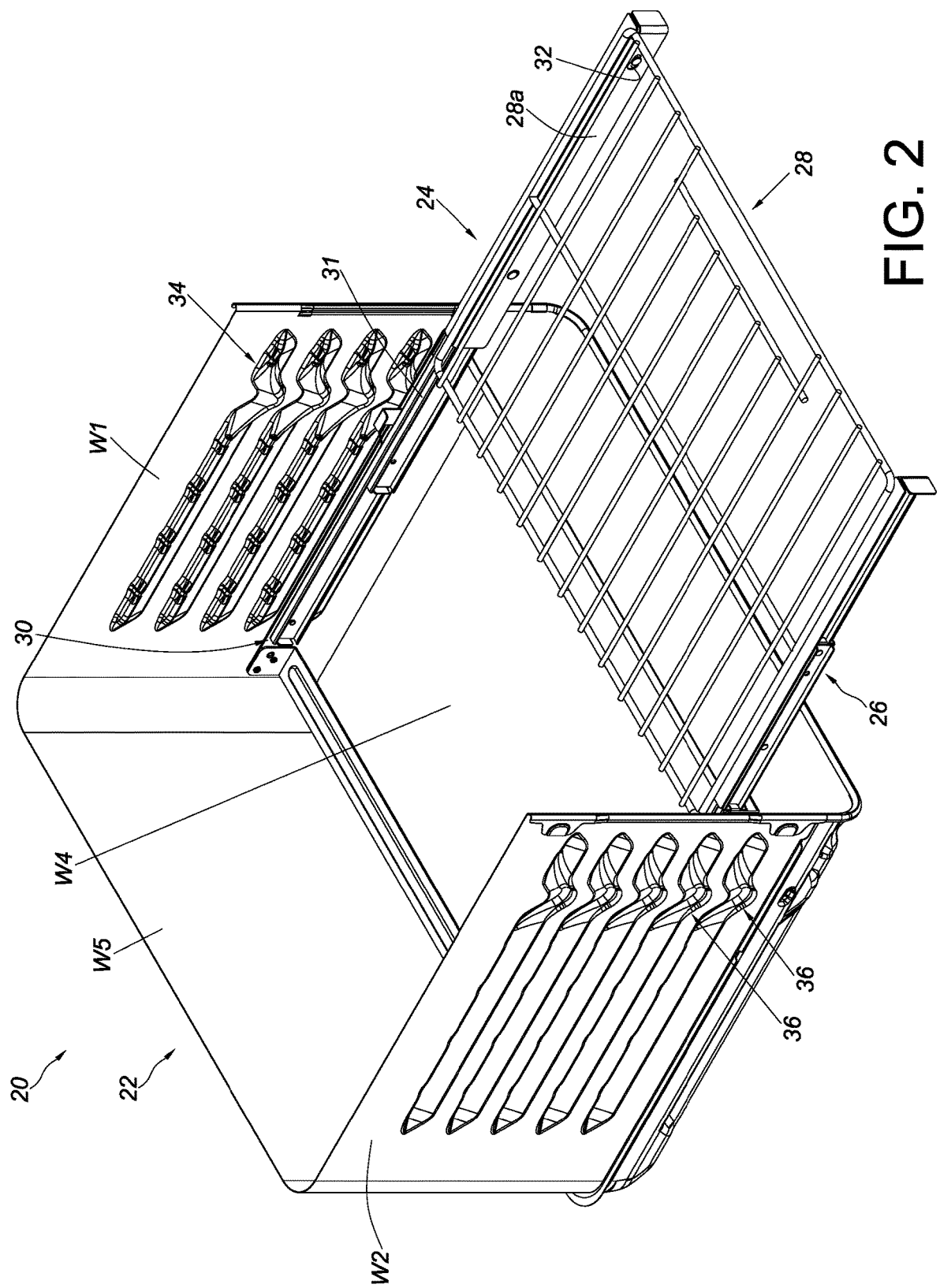
FIG. 2 is a perspective view of the cabinet according to the embodiment of the present invention, showing the object in an extended state with respect to the cabinet.

Referring to FIG. 2, in which the top wall W3 of the equipment body 22 is omitted, the object 28 can be pulled out of the space S of the equipment body 22 with respect to the first slide rail mechanism 24 via the movable rail 32. Preferably, the first slide rail mechanism 24 further includes a middle rail 31 movably mounted between the movable rail 32 and the supporting rail 30 in order to increase the distance for which the movable rail 32 can be displaced with respect to the supporting rail 30.

Figure 3:
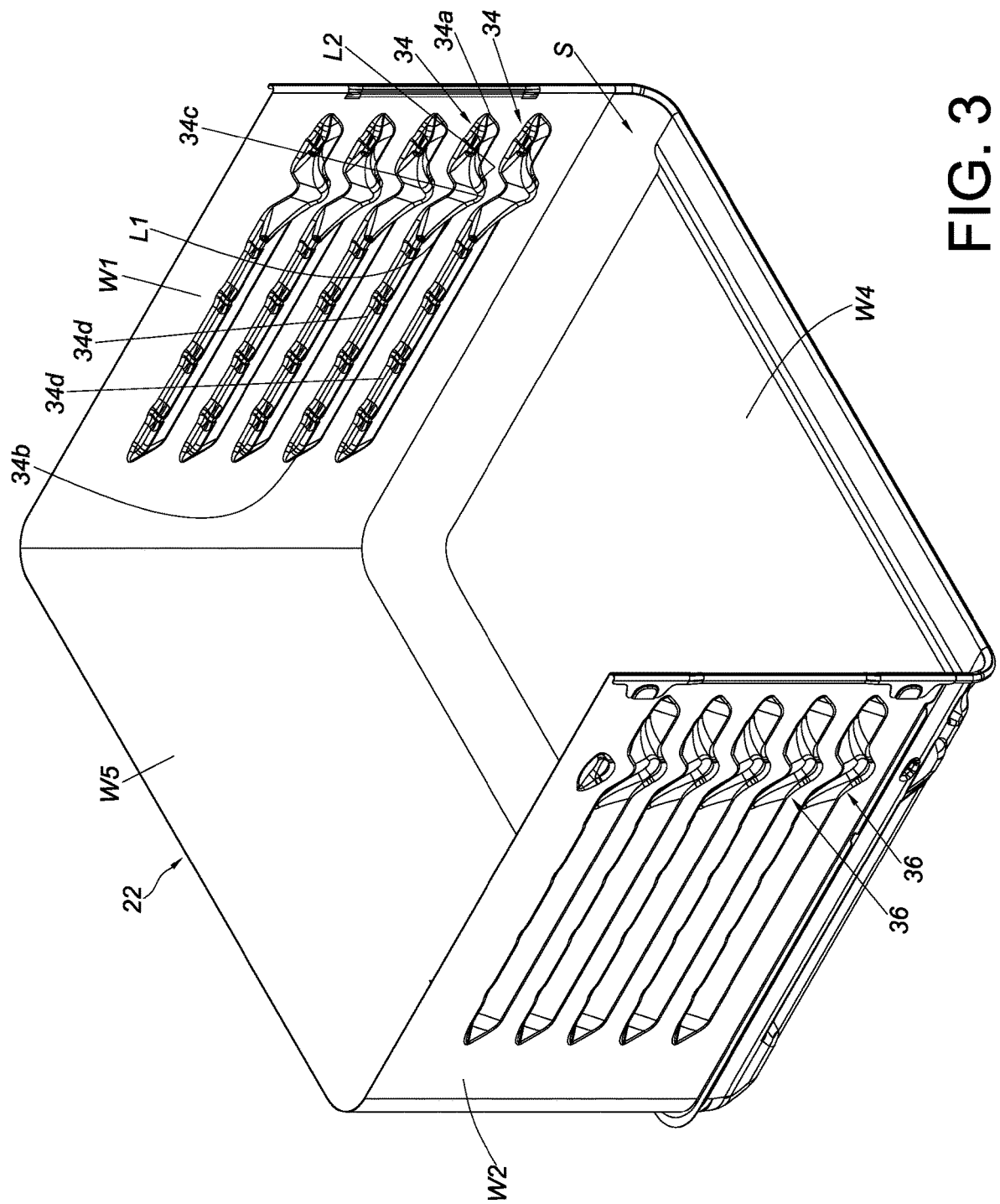
FIG. 3 is a perspective view of the interior of the cabinet according to the embodiment of the present invention.

Referring to FIG. 3, in which the first slide rail mechanism 24, the second slide rail mechanism 26, and the object 28 as well as the top wall W3 of the equipment body 22 are omitted, one of the first wall W1 and the second wall W2 of the equipment body 22 is provided with a plurality of identical and spaced-apart first guiding paths 34, and the other of the first wall W1 and the second wall W2 is provided with a plurality of identical and spaced-apart second guiding paths 36, wherein each second guiding path 36 has substantially the same structural configuration as each first guiding path 34. Here, and by way of example, the first guiding paths 34 are ridges projecting from the first wall W1 toward the second wall W2, and the second guiding paths 36 are ridges projecting from the second wall W2 toward the first wall W1. Implementation of the guiding paths, however, is not limited to the foregoing. Each first guiding path 34 has a front end 34a, a rear end 34b, a blocking feature 34c between the front end 34a and the rear end 34b, and preferably also a longitudinal supporting section 34d between the rear end 34b and the blocking feature 34c, wherein the blocking feature 34c has two opposite sides, namely a first side L1 and a second side L2. The supporting rail 30 of the first slide rail mechanism 24 can be supported by the longitudinal supporting section 34d of one of each two adjacent first guiding paths 34 or be located between each two adjacent first guiding paths 34 (similarly, the supporting rail 30 of the second slide rail mechanism 26 can be supported by the longitudinal supporting section 34d of one of each two adjacent second guiding paths 36 or be located between each two adjacent second guiding paths 36).

Figure 4:
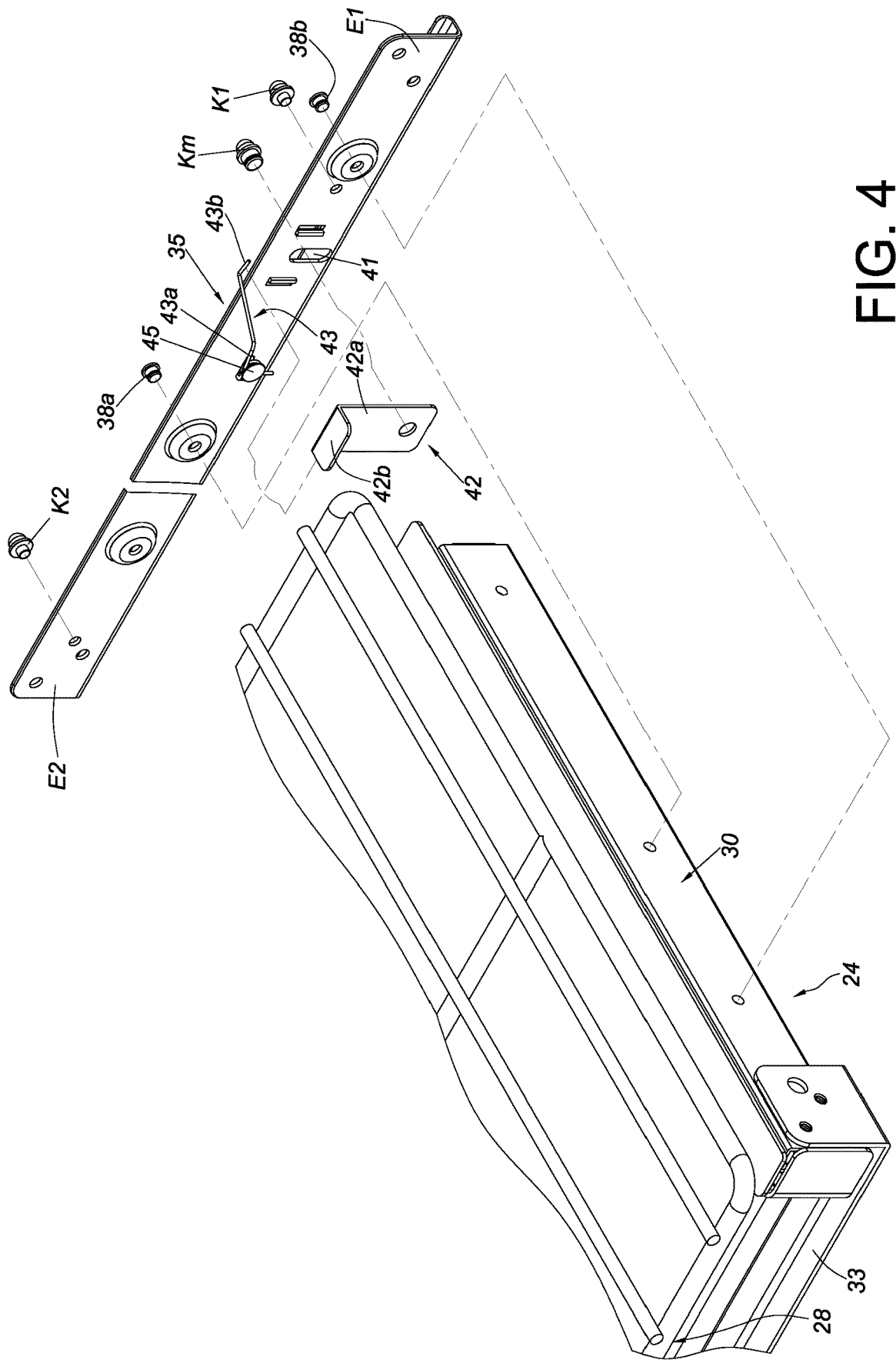
FIG. 4 is an exploded perspective view of a slide rail mechanism in the cabinet according to the embodiment of the present invention.
Figure 5:
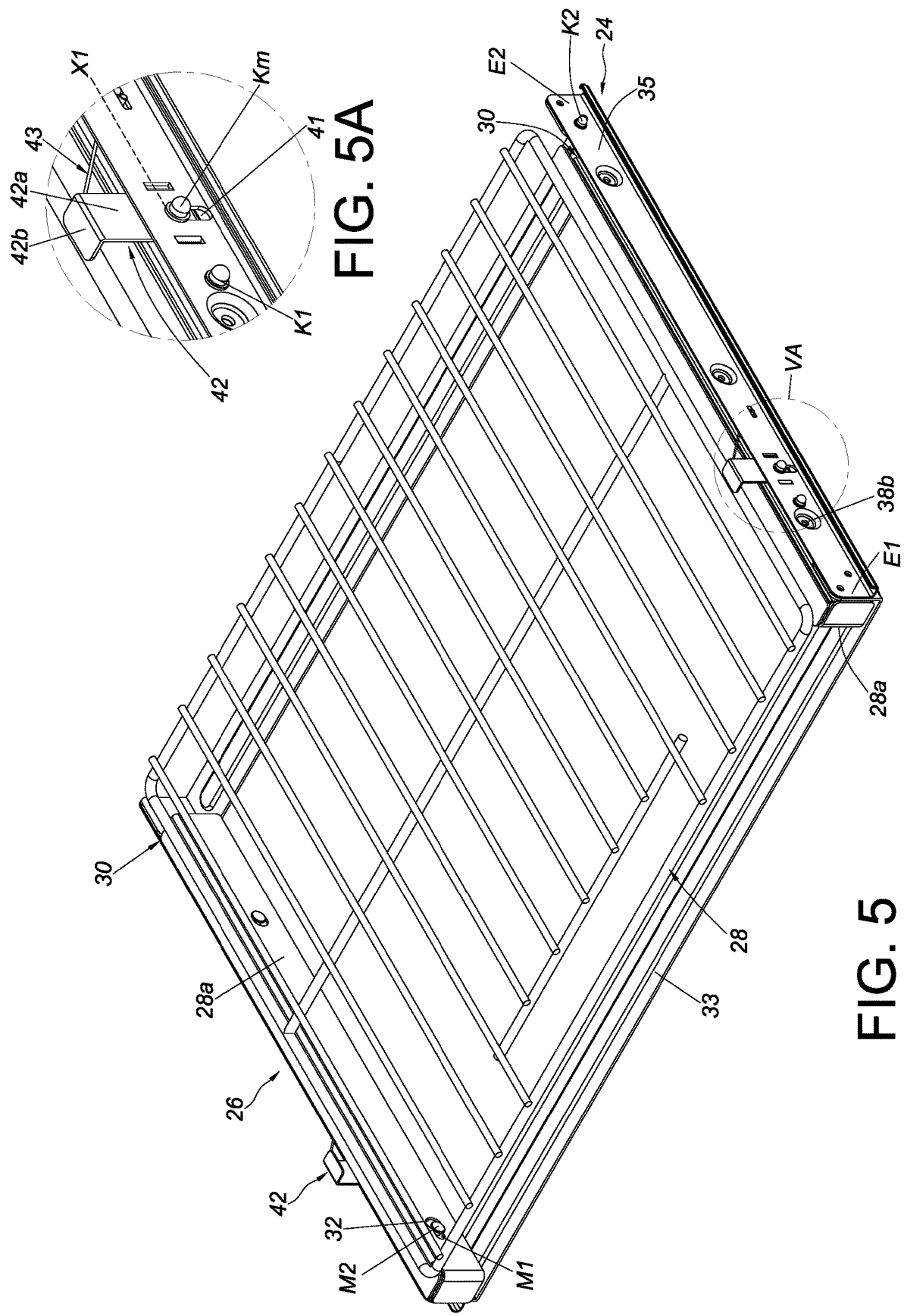
FIG. 5 is a perspective view showing that two slide rail mechanisms are provided respectively on the two lateral sides of the cabinet according to the embodiment of the present invention, wherein the operating member of each slide rail mechanism is operated to move the corresponding stop to a first position.

Referring to FIG. 4 and FIG. 5, the first slide rail mechanism 24 and the second slide rail mechanism 26 are provided on the two lateral sides of the object 28 respectively. As stated above, the first slide rail mechanism 24 has substantially the same structural configuration as the second slide rail mechanism 26, so the following description is directed only to the first slide rail mechanism 24 for the sake of brevity. The first slide rail mechanism 24 includes the supporting rail 30 and a bracket 35 connected to the supporting rail 30, wherein the supporting rail 30 and the bracket 35 constitute a slide rail kit. Here, the bracket 35 is connected to the supporting rail 30 by at least one connecting member (e.g., a first connecting member 38a and a second connecting member 38b) by way of example. In an alternative embodiment, the bracket 35 may be integrated with the supporting rail 30 instead. The supporting rail 30 and the bracket 35, therefore, can be viewed as the same component. The first slide rail mechanism 24 further includes a stop Km. The stop Km can be operated by a user and thus moved with respect to the supporting rail 30 (or the bracket 35) of the first slide rail mechanism 24.

Preferably, the first slide rail mechanism 24 further includes an operating member 42 connected to the stop Km and configured to be operated. For example, the operating member 42 can be linearly displaced in order to drive the stop Km into displacement.

Preferably, the supporting rail 30 (or the bracket 35) has a position limiting feature 41. In this embodiment, and by way of example, it is the bracket 35 that is provided with the position limiting feature 41, and the position limiting feature 41 is a bounded slot (or a bounded long groove) that brings two opposite sides of the bracket 35 into communication. The stop Km extends through a portion of the position limiting feature 41 and can therefore move only within a limited range. The orientation of the position limiting feature 41 is substantially perpendicular to the longitudinal direction of the supporting rail 30.

Preferably, the operating member 42 has a body portion 42a and an operating portion 42b bent (for example but not limited to perpendicularly bent) with respect to the body portion 42a. The stop Km is connected to the body portion 42a. The operating portion 42b of the operating member 42 lies above the bracket 35 to facilitate operation by the user.

Preferably, the first slide rail mechanism 24 further includes an elastic member 43 for applying an elastic force to the operating member 42 so that the operating member 42 can hold the stop Km at a first position X1 by way of the elastic force of the elastic member 43. Here, the elastic member 43 has a first elastic end 43a and a second elastic end 43b. The first elastic end 43a is connected to the supporting rail 30 (or the bracket 35) by a mounting member 45 while the second elastic end 43b adds an elastic load to the operating member 42.

Preferably, the first slide rail mechanism 24 further includes a first stop portion K1 and a second stop portion K2, both disposed at the supporting rail 30 (or the bracket 35). In this embodiment, both the first stop portion K1 and the second stop portion K2 are disposed at the bracket 35 by way of example. The first stop portion K1 is adjacent to a first end portion E1 (such as but not limited to a front end portion) of the supporting rail 30 (or of the bracket 35), and the second stop portion K2 is adjacent to a second end portion E2 (such as but not limited to a rear end portion) of the supporting rail 30 (or of the bracket 35). The stop Km is located between the first stop portion K1 and the second stop portion K2.

Figure 6:
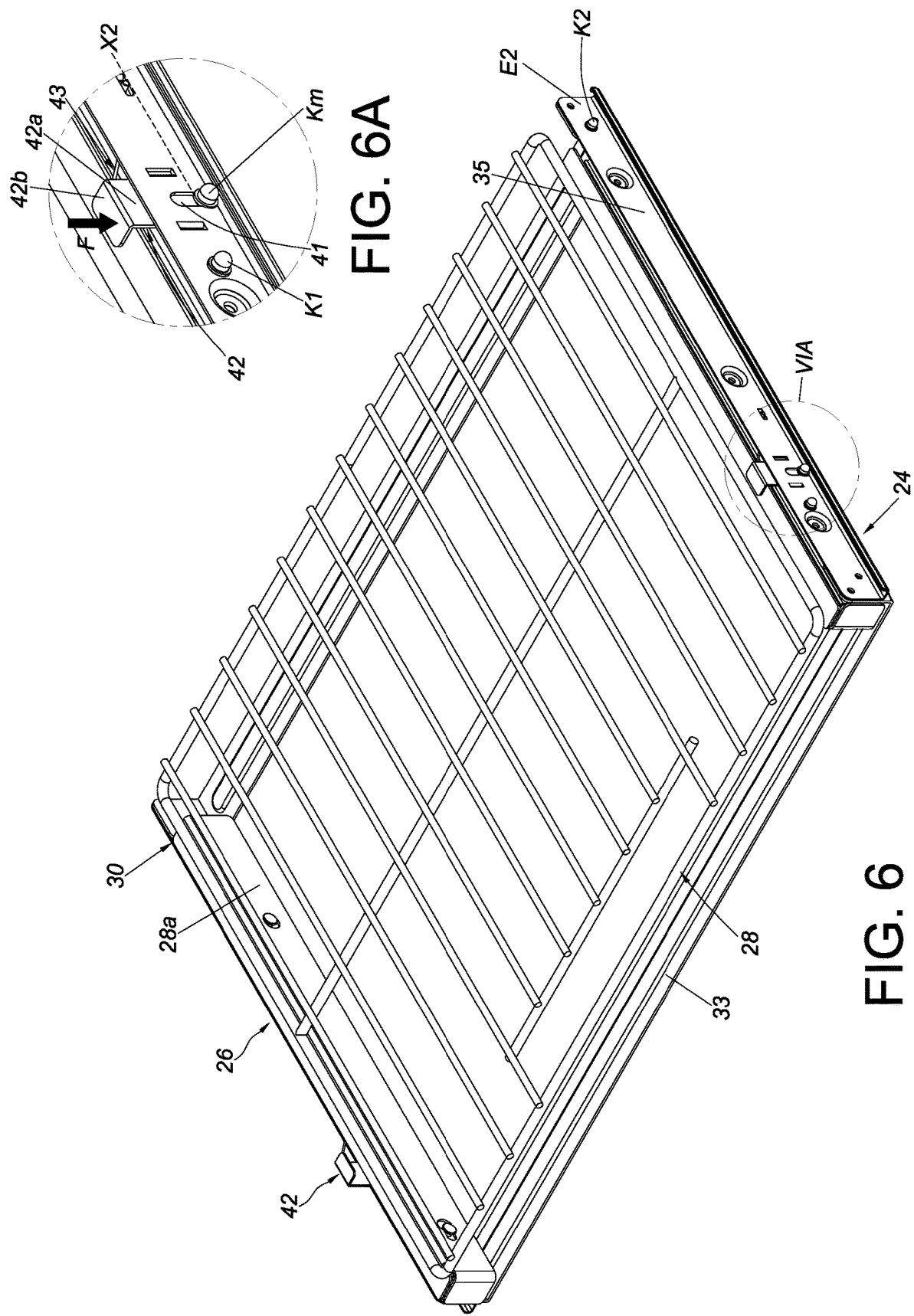
FIG. 6 is a perspective view showing that two slide rail mechanisms are provided respectively on the two lateral sides of the cabinet according to the embodiment of the present invention, wherein the operating member of each slide rail mechanism is operated to move the corresponding stop to a second position.

Referring to FIG. 6, the user may apply a force F to the operating portion 42b of the operating member 42 in order to operate the stop Km and thereby displace the stop Km with respect to the supporting rail 30 from the first position X1 to a second position X2. While the force F is applied, the elastic member 43 accumulates an elastic force, and once the user stops applying the force F, the operating member 42 drives the stop Km back to the first position X1 in response to the release of the accumulated elastic force.

Figure 7:
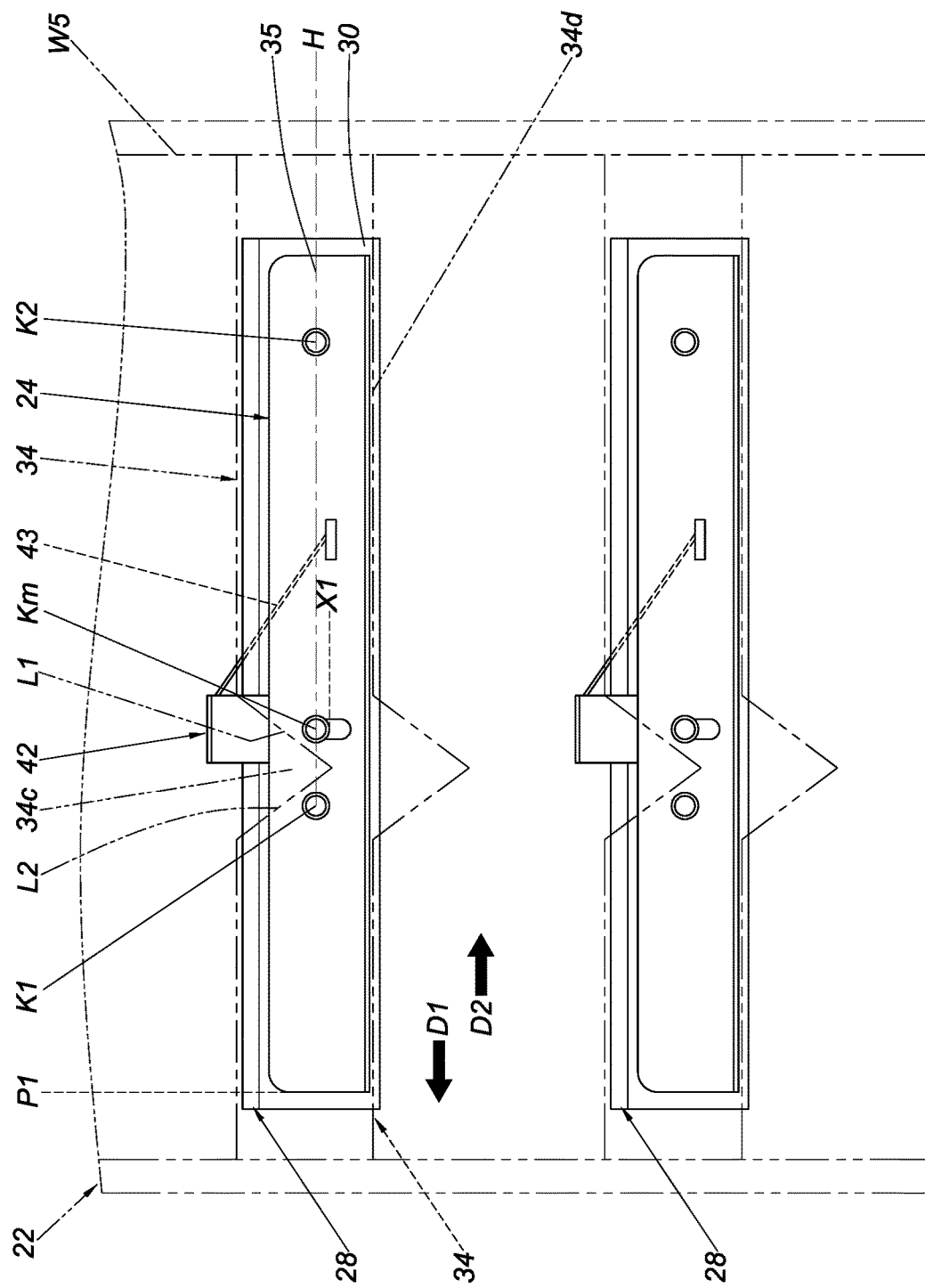
FIG. 7 is a schematic view showing that a plurality of objects are in the retracted state with respect to the cabinet according to the embodiment of the present invention.

Referring to FIG. 7, a plurality of first slide rail mechanisms 24 and a plurality of second slide rail mechanisms 26 (not shown) can be used in pairs to carry a plurality of objects 28. Take the upper first slide rail mechanism 24 in FIG. 7 (hereinafter referred to as the first slide rail mechanism 24 for the sake of simplicity) and the corresponding second slide rail mechanism 26 (not shown) for example (only the first slide rail mechanism 24 will be described below now that the corresponding second slide rail mechanism 26 has substantially the same structural configuration as the first slide rail mechanism 24). The supporting rail 30 of the first slide rail mechanism 24 is supported by the longitudinal supporting section 34d of one of two adjacent first guiding paths 34, and the supporting rail 30 (or the bracket 35) lies between the two adjacent first guiding paths 34. It is worth mentioning that if in an alternative embodiment the first wall W1 of the equipment body 22 is provided with only one first guiding path 34 rather than a plurality of first guiding paths 34, the supporting rail 30 of the first slide rail mechanism 24 can be supported by the one longitudinal supporting section on the first wall W1 of the equipment body 22 just as well; in other words, this single longitudinal supporting section can work in place of "the longitudinal supporting section 34d of one of two adjacent first guiding paths 34" stated above. The present invention, therefore, has no limitation on the number of the guiding paths.

More specifically, with continued reference to FIG. 7, the first slide rail mechanism 24 and the corresponding second slide rail mechanism 26 (not shown) are at a first predetermined position P1 with respect to the equipment body 22, and the stop Km is at the first position X1, where the stop Km is generally on the same horizontal plane H as the first stop portion K1 and the second stop portion K2 and can therefore be blocked by the blocking feature 34c of the other of the two adjacent first guiding paths 34 (hereinafter referred to as the first guiding path 34 for the sake of simplicity), lest the supporting rail 30 be longitudinally displaced with respect to the equipment body 22 from the first predetermined position P1 in a first direction D1 (such as but not limited to an opening direction).

It is preferable that the stop Km, now at the first position X1, is blocked at the first side L1 of the blocking feature 34c of the first guiding path 34 to prevent the supporting rail 30 from being longitudinally displaced with respect to the equipment body 22 from the first predetermined position P1 in the first direction D1, and that the first stop portion K1 is at the same time blocked at the second side L2 of the blocking feature 34c of the first guiding path 34 to prevent the supporting rail 30 from being longitudinally displaced with respect to the equipment body 22 from the first predetermined position P1 in a second direction D2, which is the opposite direction of the first direction D1, such as but not limited to a retracting direction.

Figure 8:
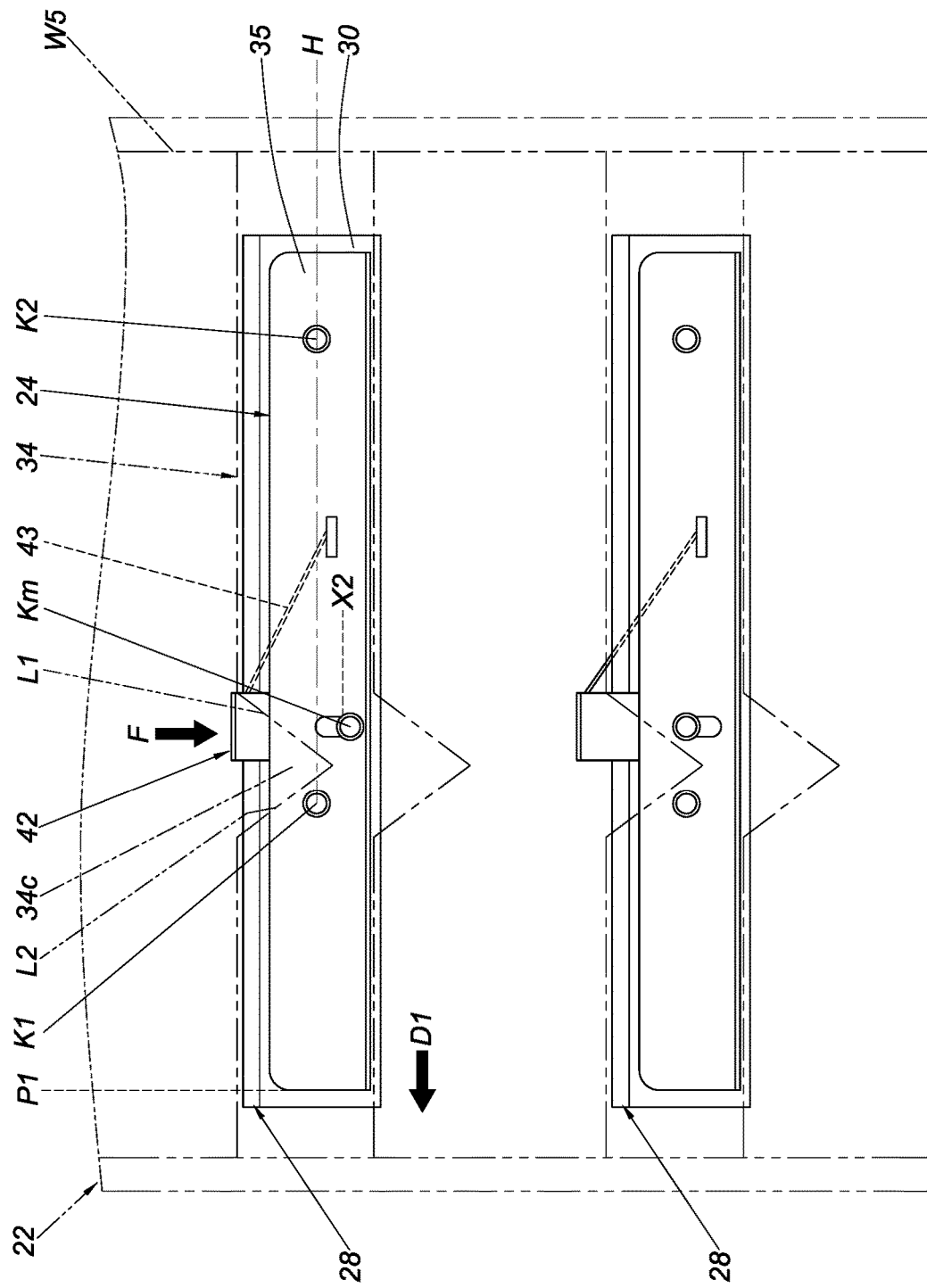
FIG. 8 is a schematic view showing that the operating members of the slide rail mechanisms carrying one of the objects are operated to displace the corresponding stops to the second position.
Figure 9:
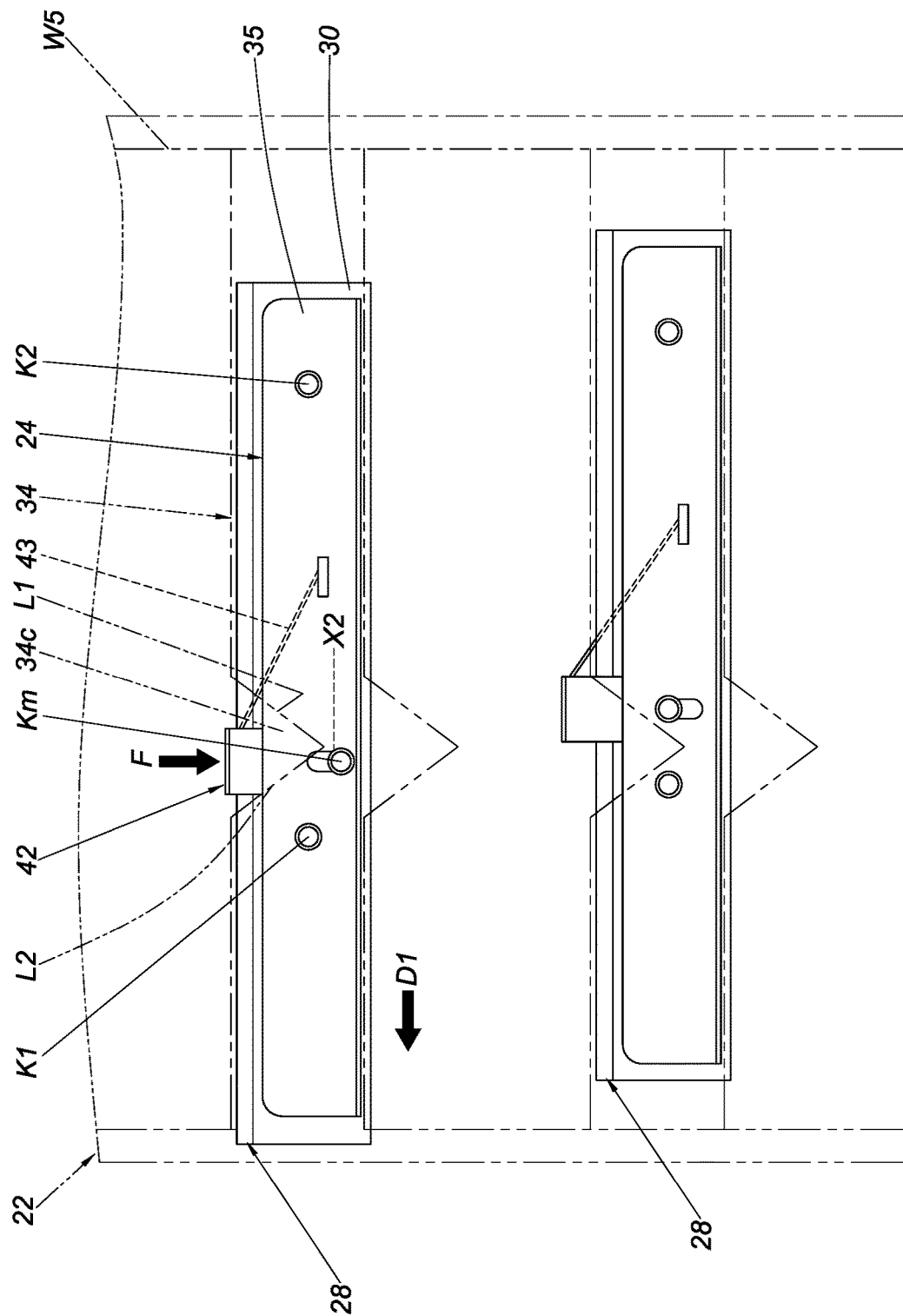
FIG. 9 is a schematic view showing that the operating members of the slide rail mechanisms carrying one of the objects are operated to displace the corresponding stops to the second position, and that said object is displaced in a first direction.

Referring to FIG. 8 and FIG. 9, when it is desired to clean or wash the object 28 or perform maintenance work on the first slide rail mechanism 24 and the corresponding second slide rail mechanism 26 (not shown), the user may apply the force F to the operating member 42 of the first slide rail mechanism 24 in order to operate the stop Km and thereby displace the stop Km with respect to the supporting rail 30 from the first position X1 to the second position X2, where the stop Km is no longer on the same horizontal plane H as the first stop portion K1 and the second stop portion K2, and where the elastic member 43 is in an elastic force accumulating state. The stop Km, when at the second position X2, is no longer blocked at the first side L1 of the blocking feature 34c of the first guiding path 34 and therefore allows the supporting rail 30 to be displaced with respect to the equipment body 22 from the first predetermined position P1 in the first direction D1.

Figure 10:
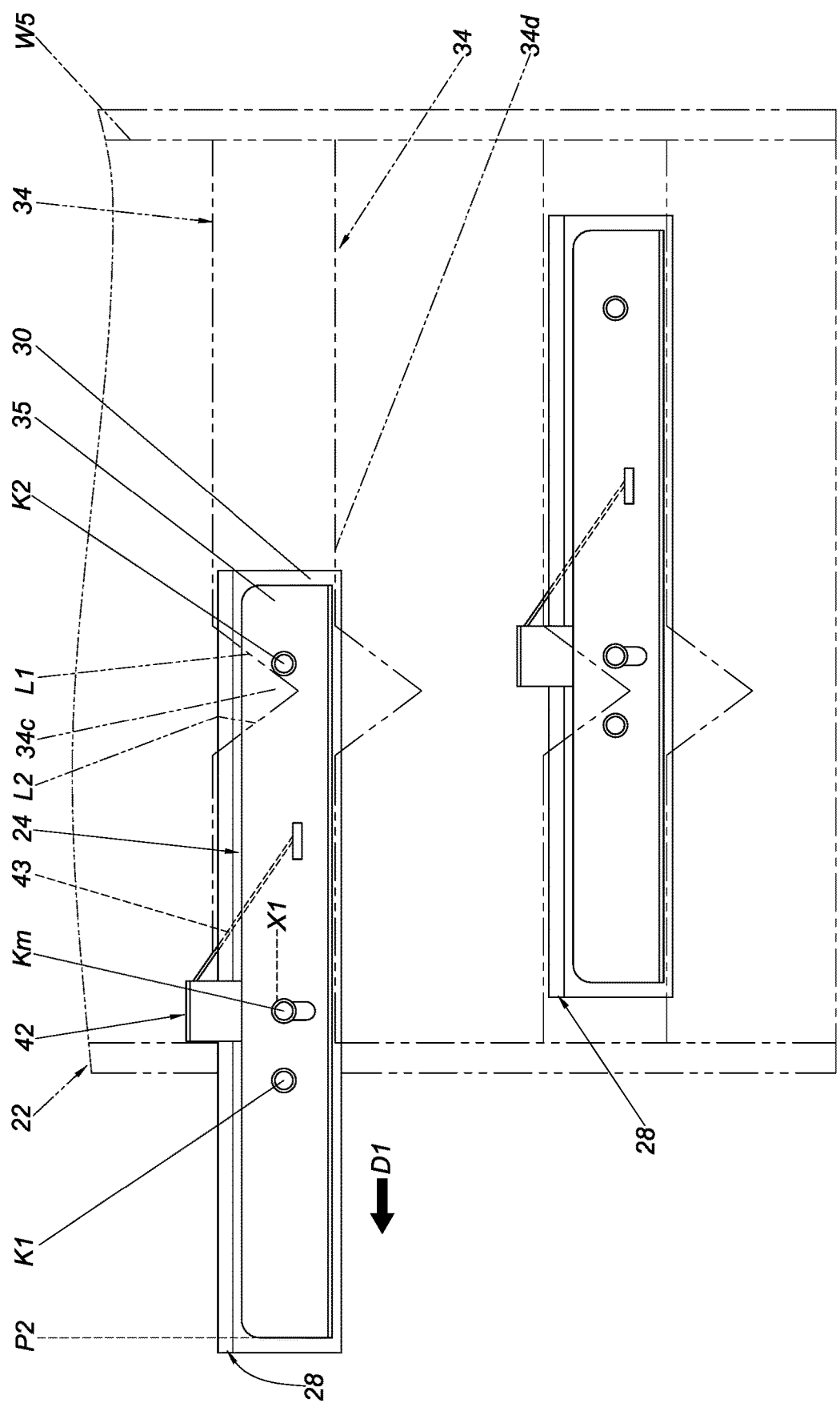
FIG. 10 is a schematic view showing that said object is further displaced in the first direction.

Once the user stops applying the force F to the operating member 42, referring to FIG. 10, the operating member 42 drives the stop Km back to the first position X1 in response to the elastic member 43 releasing the elastic force accumulated therein. When the supporting rail 30 reaches a second predetermined position P2 after being displaced with respect to the equipment body 22 from the first predetermined position P1 in the first direction D1, the second stop portion K2 is blocked at the first side L1 of the blocking feature 34c of the first guiding path 34 to prevent the supporting rail 30 from being displaced with respect to the equipment body 22 from the second predetermined position P2 in the first direction D1.

Figure 11:
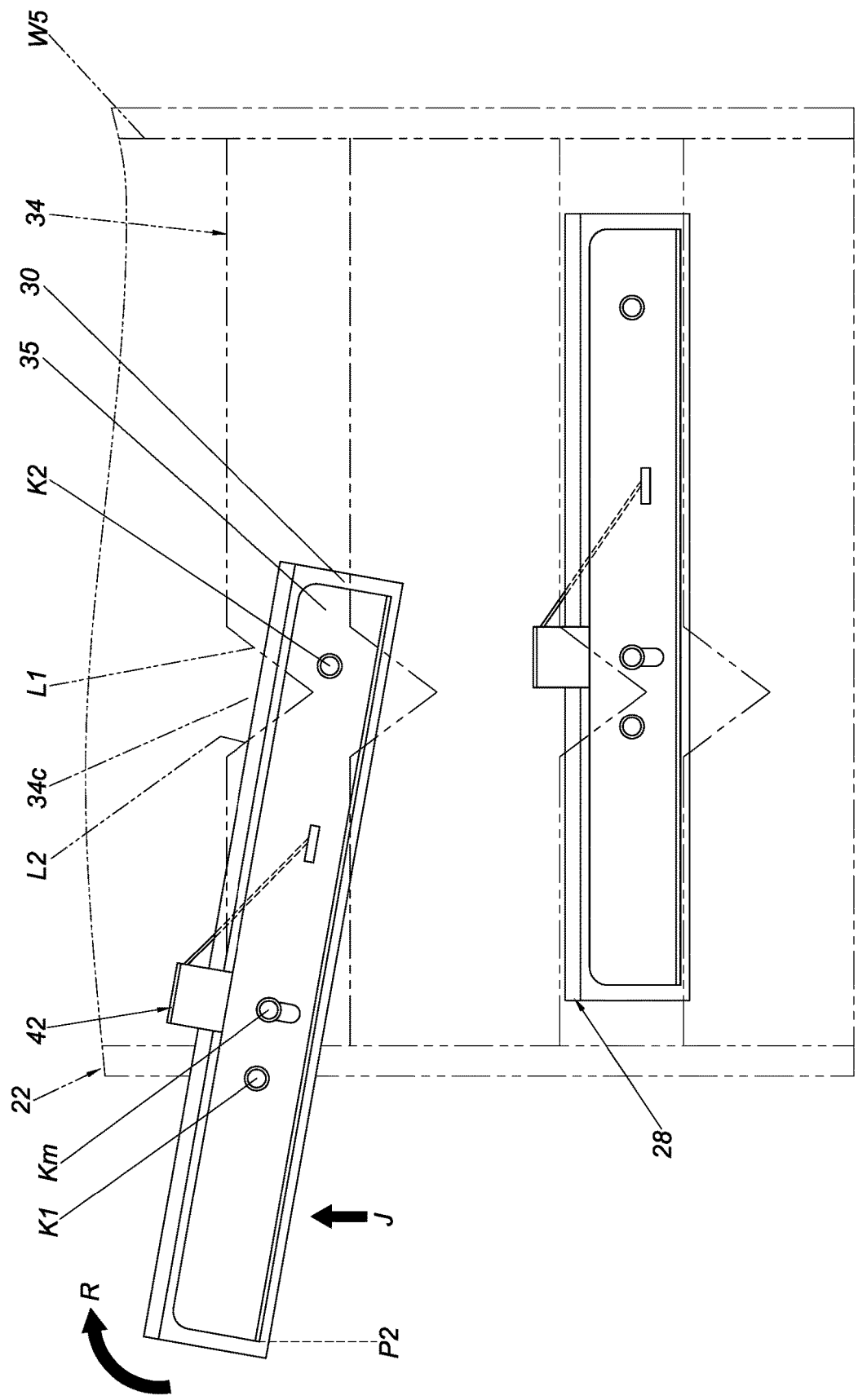
FIG. 11 is a schematic view showing that said object arrives at a second predetermined position and is tilted through an angle by a force applied to the corresponding slide rail mechanisms so that said object can be displaced from the second predetermined position in the first direction.

Referring to FIG. 11, a force J is applied to the supporting rail 30 to tilt the supporting rail 30 through an angle R with respect to the first guiding path 34. As a result, the second stop portion K2 is no longer blocked at the first side L1 of the blocking feature 34c of the first guiding path 34, and the supporting rail 30 is therefore allowed to be detached with respect to the equipment body 22 from the second predetermined position P2 in the first direction D1 (see FIG. 12 and FIG. 13). Thus, both the first slide rail mechanism 24 and the corresponding second slide rail mechanism 26 (not shown) can be detached from the equipment body 22 to facilitate maintenance of the object 28, the first slide rail mechanism 24, and the corresponding second slide rail mechanism 26 (not shown).

Figure 12:
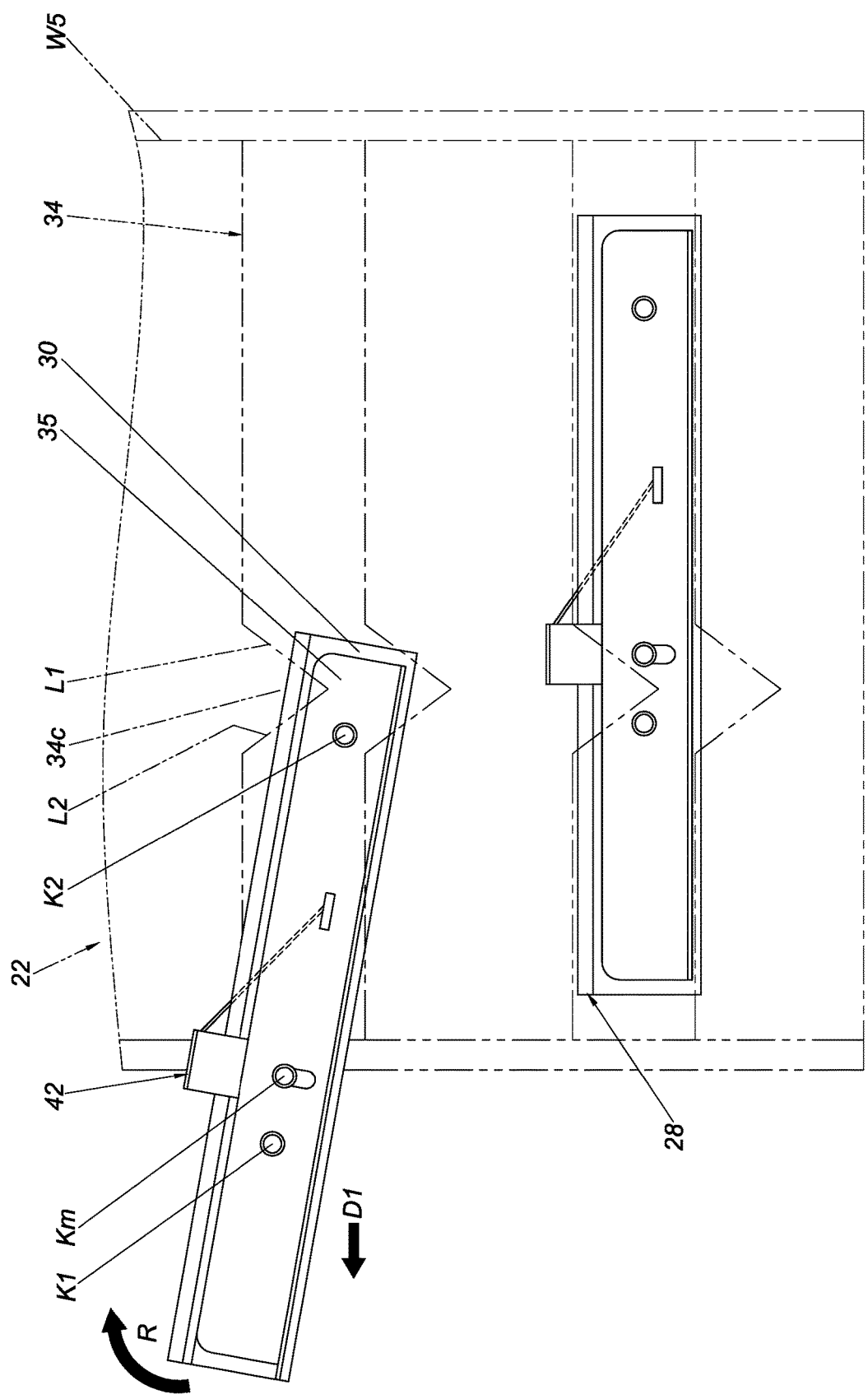
FIG. 12 is a schematic view showing that said object is displaced in the first direction while tilted at the angle.
Figure 13:
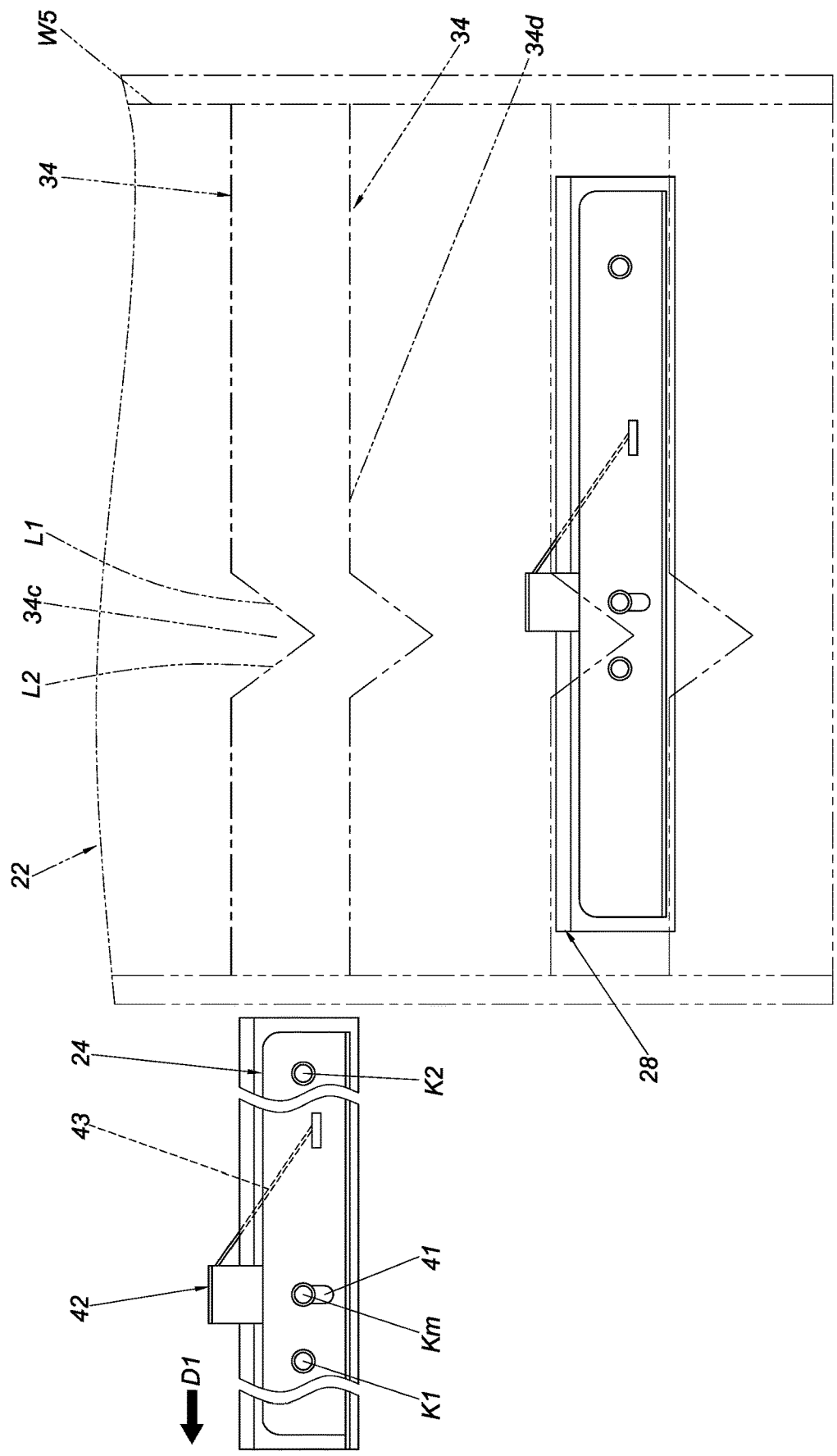
FIG. 13 is a schematic view showing that said object is detached from the equipment body along with the corresponding slide rail mechanisms.
Figure 14:
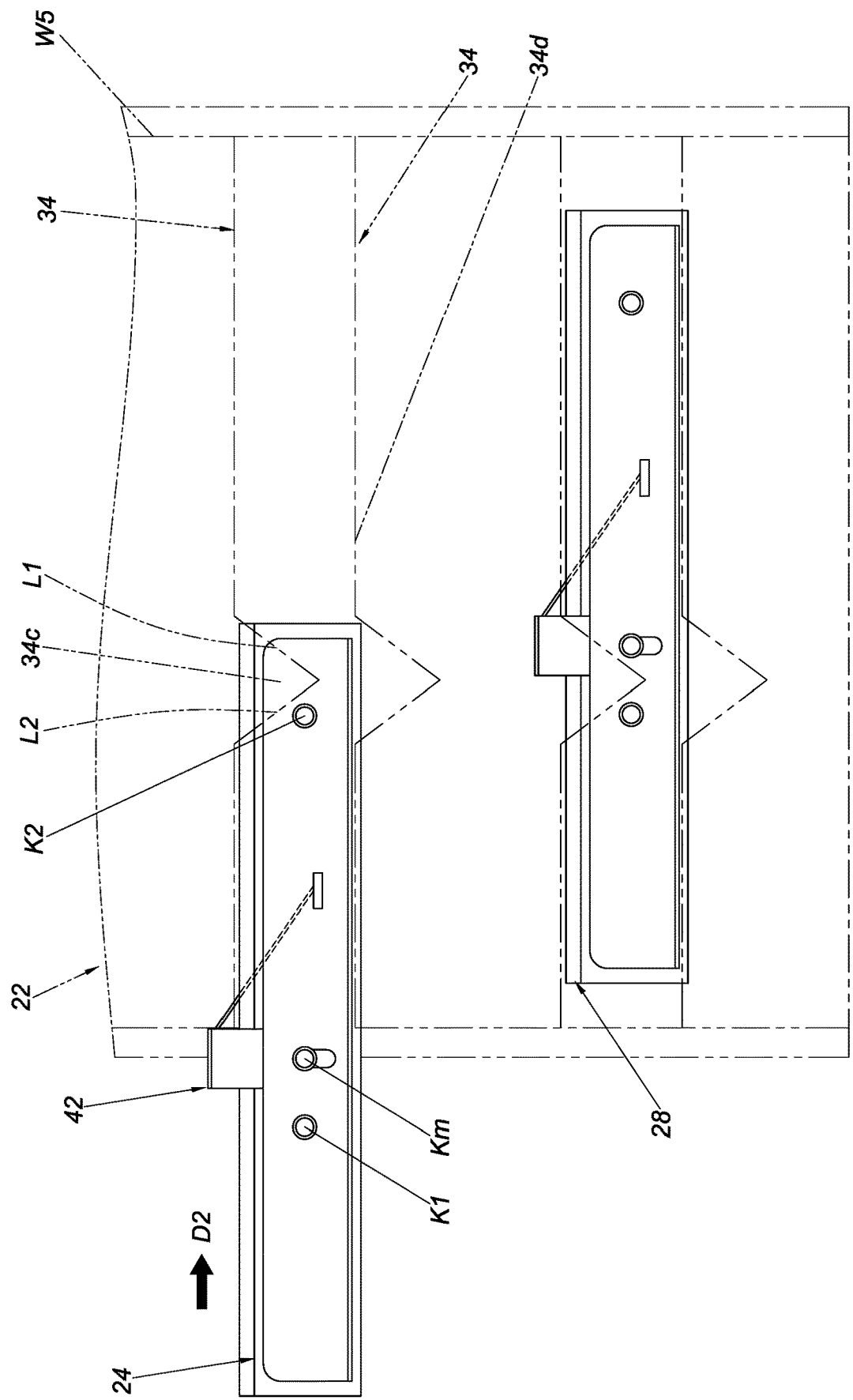
FIG. 14 is a schematic view showing that said object is mounted again to the equipment body along with the corresponding slide rail mechanisms.

Referring to FIG. 14, the object 28, the first slide rail mechanism 24, and the corresponding second slide rail mechanism 26 (not shown) can be mounted back into the aforesaid space of the equipment body 22 along the second direction D2 until the second stop portion K2 is blocked at the second side L2 of the blocking feature 34c of the first guiding path 34. The user may then apply the force J again in order to tilt the supporting rail 30 through the angle R with respect to the first guiding path 34 (as shown in FIG. 12), thereby freeing the second stop portion K2 from blockage at the second side L2 of the blocking feature 34c of the first guiding path 34, allowing the supporting rail 30 to be retracted with respect to the equipment body 22 in the second direction D2. The principle of the retraction process can be understood by referring to FIG. 11, FIG. 10, FIG. 9, FIG. 8, and FIG. 7 in that order, so a detailed description of the process is omitted for the sake of brevity.

It can be known from the above that the foregoing embodiment preferably has the following features:

1. Unlike its prior art counterparts, the stop Km can be operated and thus moved with respect to the supporting rail 30. Preferably, the operating member 42 makes it easy for the user to operate the stop Km and thereby displace the stop Km from the first position X1 to the second position X2.
2. When at the first position X1, the stop Km can be blocked at the first side L1 of the blocking feature 34c of the first guiding path 34 to prevent the supporting rail 30 from being longitudinally displaced with respect to the equipment body 22 from the first predetermined position P1 in the first direction D1. The first stop portion K1, on the other hand, can be blocked at the second side L2 of the blocking feature 34c of the first guiding path 34 to prevent the supporting rail 30 from being longitudinally displaced with respect to the equipment body 22 from the first predetermined position P1 in the second direction D2.
3. The supporting member 33 connected between the second slide rail mechanism 26 and the first slide rail mechanism 24 is intended to, for example, increase the stability with which the second slide rail mechanism 26 and the first slide rail mechanism 24 are mounted in the equipment body 22 or improve the structural strength or supporting strength of the second slide rail mechanism 26 and of the first slide rail mechanism 24.
4. The slide rail kit can be rapidly detached and be applied to various cabinets.

While the present invention has been disclosed through the preferred embodiment described above, the embodiment is not intended to be restrictive of the scope of the invention. The scope of patent protection sought by the applicant is defined by the appended claims.

What is claimed is:
1. A cabinet, comprising:
   an equipment body including a first wall and a second wall, wherein one of the first wall and the second wall is provided with a first guiding path, and the first guiding path has a front end, a rear end, and a blocking feature between the front end and the rear end, the blocking feature having a first side and a second side; and a first slide rail mechanism including a supporting rail, first and second stop portions, and a stop, wherein the stop is configured to be operated and thus moved with respect to the supporting rail;

wherein the stop, when at a first position, is able to be blocked at the first side of the blocking feature of the first guiding path in order to prevent the supporting rail from displacement with respect to the equipment body from a first predetermined position in an opening direction, wherein the stop, when at a second position, is unable to be blocked by the blocking feature of the first guiding path and thus allows the supporting rail to be displaced with respect to the equipment body from the first predetermined position in the opening direction, wherein the first stop portion is blocked at the second side of the blocking feature of the first guiding path in order to prevent the supporting rail from displacement with respect to the equipment body from the first predetermined position in a retracting direction, and wherein, when the supporting rail reaches a second predetermined position after displacement with respect to the equipment body from the first predetermined position in the opening direction, the second stop portion is blocked at the first side of the blocking feature of the first guiding path in order to prevent the supporting rail from displacement with respect to the equipment body from the second predetermined position in the opening direction.

2. The cabinet of claim 1, wherein the first slide rail mechanism further includes an operating member for operating the stop and thereby displacing the stop with respect to the supporting rail from the first position to the second position.

3. The cabinet of claim 2, wherein the first slide rail mechanism further includes an elastic member for applying an elastic force to the operating member in order for the operating member to keep the stop at the first position via the elastic force of the elastic member.

4. The cabinet of claim 1, wherein by applying a force to the supporting rail and thereby tilting the supporting rail through an angle with respect to the first guiding path, the second stop portion is freed from blockage at the first side of the blocking feature of the first guiding path, thus allowing the supporting rail to be detached with respect to the equipment body from the second predetermined position in the opening direction.

5. The cabinet of claim 1, wherein the first slide rail mechanism further includes a movable rail longitudinally displaceable with respect to the supporting rail, the movable rail is configured to carry an object, and the first wall and the second wall define a space therebetween for receiving the object.

6. The cabinet of claim 5, wherein the object is an oven rack, and the equipment body is an enclosing structure of an oven.

7. The cabinet of claim 1, wherein the other of the first wall and the second wall is provided with a second guiding path, the second guiding path having a substantially same structural configuration as the first guiding path; and wherein the cabinet further comprises a second slide rail mechanism, the second slide rail mechanism having a substantially same structural configuration as the first slide rail mechanism.

8. The cabinet of claim 7, further comprising a supporting member connected between the second slide rail mechanism and the first slide rail mechanism.

9. A slide rail kit, comprising:
a supporting rail;
a bracket connected to the supporting rail and including a first stop portion, a second stop portion, and a stop between the first stop portion and the second stop portion; and
an operating member connected to the stop and configured to be operated in order to operate the stop and thereby displace the stop from a first position to a second position;
wherein the stop is substantially on a same horizontal plane as the first stop portion and the second stop portion when at the first position;
wherein the stop is not on the same horizontal plane as the first stop portion and the second stop portion when at the second position.

10. The slide rail kit of claim 9, further comprising an elastic member for applying an elastic force to the operating member in order for the operating member to keep the stop at the first position via the elastic force of the elastic member.

11. The slide rail kit of claim 10, wherein the bracket includes a position limiting feature, and the stop has a limited range of travel defined by the position limiting feature.

12. The slide rail kit of claim 11, wherein the position limiting feature is a bounded slot or a bounded long groove and brings two opposite sides of the bracket into communication, and the stop extends through a portion of the position limiting feature to establish the limited range of travel.

13. The slide rail kit of claim 12, wherein the position limiting feature has an orientation substantially perpendicular to a longitudinal direction of the supporting rail.

14. The slide rail kit of claim 13, further comprising a movable rail and a middle rail, wherein the movable rail is longitudinally displaceable with respect to the supporting rail, and the middle rail is movably mounted between the movable rail and the supporting rail to increase a distance for which the movable rail is able to be displaced with respect to the supporting rail.

15. The slide rail kit of claim 9, wherein the operating member is configured to be linearly displaced in order to drive the stop into displacement.

16. The slide rail kit of claim 15, wherein the operating member includes a body portion and an operating portion, the stop is connected to the body portion, and the operating portion of the operating member is located above the bracket.

17. The slide rail kit of claim 16, further comprising a movable rail and a middle rail, wherein the movable rail is longitudinally displaceable with respect to the supporting rail, and the middle rail is movably mounted between the movable rail and the supporting rail to increase a distance for which the movable rail is able to be displaced with respect to the supporting rail.

* * * * *